United States Patent [19]

Hutchison et al.

[11] 4,310,799

[45] Jan. 12, 1982

[54] COIL WINDING FOR QUADRUPOLAR FIELDS

[75] Inventors: James M. S. Hutchison; Robert J. Sutherland; William A. Edelstein; John R. Mallard, all of Aberdeen, Scotland

[73] Assignee: National Research Development Corporation, London, England

[21] Appl. No.: 84,562

[22] Filed: Oct. 15, 1979

[30] Foreign Application Priority Data

Oct. 17, 1978 [GB] United Kingdom ............... 40779/78

[51] Int. Cl.³ ............................................. G01N 27/00
[52] U.S. Cl. ..................................... 324/319; 335/213
[58] Field of Search ............................. 324/318–320; 335/213

[56] References Cited

U.S. PATENT DOCUMENTS

| | | | |
|---|---|---|---|
| 3,287,630 | 11/1966 | Gang | 324/320 |
| 3,488,541 | 1/1970 | Barbin | 335/213 |
| 3,569,823 | 3/1971 | Golay | 324/320 |
| 3,582,779 | 6/1971 | Bloom | 324/320 |
| 3,689,860 | 9/1972 | Bauzhis et al. | 335/213 |

*Primary Examiner*—Michael J. Tokar
*Attorney, Agent, or Firm*—Cushman, Darby & Cushman

[57] ABSTRACT

A coil is constructed such as that required in NMR imaging apparatus and in some NMR analytical applications, gradients can be established on selected axes within a uniform magnetic field. The windings of the coil also constitute an electrostatic screen which isolates the high-frequency coupling coil from the sample. The coil comprises a pair of similar quadrupole windings uniformly interpolated on the circumference of a cylindrical surface which encloses the sample volume. The winding of each pole includes conductors lying longitudinally on the cylindrical surface and distributed symmetrically over a quadrant of the circumference, the number of conductors per radian being proportional to $\cos 2\theta$ where $\theta$ is the displacement from the center of the quadrant. Adjacent pole windings belonging to different quadrupoles thus overlap and the winding density is chosen so that the outer conductors of the two windings can be interlaid to form an effectively continuous electrostatic screen. The quadrupole windings are independent and can be energized to set up the required gradients on two axes perpendicular to each other in a uniform magnetic field directed perpendicular to the cylindrical axis. A high frequency coil can be wound helically over the field gradient windings without further shielding.

7 Claims, 8 Drawing Figures

COIL WINDING FOR QUADRUPOLAR FIELDS

The invention relates to the winding and use of coils for producing magnetic fields of quadrupolar formation of particular application in field gradient control in nuclear magnetic resonance (NMA) analytical and imaging apparatus.

In the usual forms of NMR imaging it is necessary to expose the specimen to three different kinds of magnetic field:

(1) a uniform field of constant value conventionally denoted by $B_o$ and equal in magnitude to the required Larmor precession frequency of the nuclei under observation divided by the gyromagnetic ratio for the nuclei. The field may extend through a substantial volume dependent on the subject under investigation.

(2) a high frequency field, normally at or near the Larmor precession frequency and directed perpendicularly to $B_o$ (3) a set of fields each characterised by components which increase in intensity with distance from a null plane and are oppositely directed on the two sides of the null plane. When such a field is superimposed on the field $B_o$ with a selected orientation of the null plane, gradients are produced in $B_o$ such that local values of field intensity show a linear increase from the null plane in one direction and a linear decrease from the null plane in the opposite direction. The direction in which the resultant field increases is known as the field gradient direction.

In a conventional NMR configuration, a coil for producing the high-frequency magnetic field (2) is wound around the specimen volume, frequently separated from it by a Faraday shield. This shield normally consists of a set of fine wires running longitudinally and distributed uniformly round the circumference of a cylinder, and each earthed at one end. Its purpose is to shield the specimen from any electric fields emanating from the high-frequency coil, and vice versa, without interfering with the magnetic field generated by the coil.

The field-gradient windings are placed outside this assembly, often with a second layer of electrical screening between them and the high frequency coil; they may be inside, or interleaved with the windings producing the static field $B_o$.

The energy required to produce a given magnitude of magnetic field gradient across a specimen increases as the fifth power of the diameter and it is particularly necessary to employ a coil configuration which is economical when the specimen volume must be sufficient to accommodate the human body.

It is an object of the invention to provide field gradient windings for two perpendicular axes of a large sample volume in a more economical configuration than the conventional one.

According to the invention there is provided a coil for producing magnetic fields of quadrupolar formation comprising a pair of similar quadrupole windings uniformly interpolated on the circumference of a cylinder, the winding of each pole comprising a plurality of conductors lying longitudinally on the cylindrical surface and distributed symmetrically over a respective quadrant of the surface such that the winding density is greatest at the centre of the quadrant, the conductors of adjacent poles being interdigitated to produce over the cylindrical surface a substantially uniform array of conductors effective as an electrostatic screen.

Preferably the density of each pole winding is varied in proportion to cos $2\theta$, $\theta$ being the angular displacement from the centre of the respective quadrant and the density of winding being expressed as the number of conductors per radian.

External connections may be provided to each quadrupole winding to enable the energisation of the windings to be separately controlled.

In an NMR imaging apparatus in which during operation a uniform magnetic field is applied to a sample the orientation of the coil relative to the uniform magnetic field may be arranged so that one quadrupole produces field gradients in the direction of the uniform field and the other quadrupole produces field gradients in a perpendicular direction.

In such apparatus the coil may be made of the minimum internal volume required to accommodate the sample, in insulated high frequency coupling coil being wound over the conductors circumferentially of the cylindrical surface.

The construction and operation of an embodiment of the invention will now be described with reference to the accompanying drawings in which:

FIGS. 1(a) and (b) illustrates the distribution in a section through a uniform field of the desired field gradients for NMR imaging;

FIGS. 2(a) and (b) illustrate schematic arrangements of conductors for producing the field gradients of FIGS. 1(a) and (b);

Figure 1A:
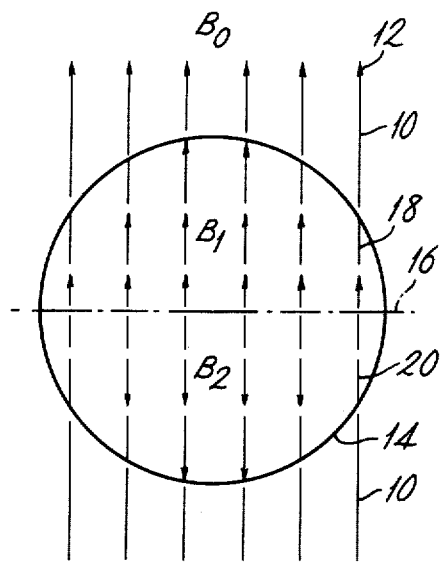
Figure 1B:
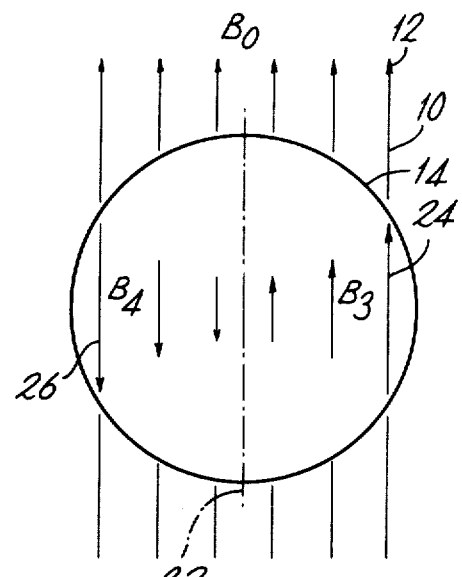

With reference to FIGS. 1(a) and 1(b) a uniform magnetic field $B_o$ is represented by lines 10, the direction of the field towards the top of the paper being indicated by arrow heads 12. The field is to be visualised as extending above and below the plane of the paper, a circle in this plane representing the intersection of the field by a cylindrical surface 14 normal to the field direction. In FIG. 1(a) a longitudinal diametric plane 16 of the surface 14 is indicated which lies perpendicularly to the direction of the field. One of the desired field gradient patterns for NMR imaging is symmetrical about the plane 16 and is generated by superimposing on the field $B_o$, oppositely directed local fields each of which increases outwardly from the plane 16. Such local fields $B_1$ and $B_2$ are represented by sets of vectors 18 and 20 respectively which increase in length as they approach the surface 14. Essentially the gradients are established in directions parallel to the field $B_o$ such that $B_o$ is locally reinforced by $B_1$ but locally diminished by $B_2$. Another desired field gradient pattern is symmetrical about a longitudinal diametric plane 22, parallel to the direction of the field $B_o$, as shown in FIG. 1(b). As before local fields indicated by $B_3$ and $B_4$ are superimposed on the field $B_o$ but in this case the gradients are observed in directions normal to the field $B_o$. Thus fields $B_3$ and $B_4$ are represented by sets of vectors 24 and 26 respectively which progressively increase in length as the point of observation moves from plane 22 toward the surface 14. $B_3$ acts to reinforce $B_o$ and $B_4$ to diminish it.

Figure 2A:
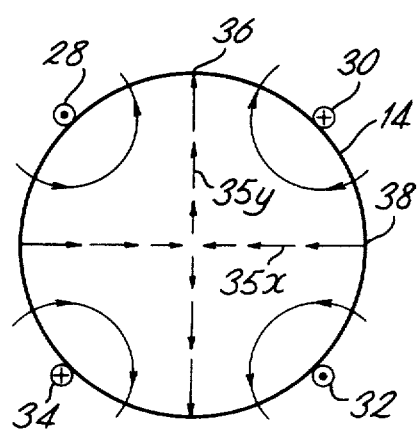

The local fields $B_1$ to $B_4$ are required to be small in value compared with $B_o$ and may be produced by quadrupoles such as are shown in FIGS. 2(a) and (b). In FIG. 2(a) four conductors 28, 30, 32, 34 lying longitudinally on the cylindrical surface 14 and uniformly spaced on the circumference of the surface are connected in series to a source of current such that the direction of current flow (conventionally shown) is reversed in adjacent quadrants.

Such an arrangement is known to produce a saddle (or quadrupolar) field as indicated by vectors 35x, 35y the lengths of which represent respectively the variation in field strength on diameters 36 and 38 which are mutually perpendicular. Vectors 35x are directed towards the axis of the cylinder where the field is zero and vectors 35y are directed away from the axis. If the field pattern of FIG. 2(a) is superimposed on the uniform field $B_o$ and the orientation is made such that diameter 38 is aligned with plane 16 then the condition of FIG. 1(a) is satisfied by the field components on and parallel to diameter 36. The components on and parallel to diameter 38 make no contribution to the required gradients and are too small in value relative to $B_o$ to produce any appreciable rotation of the resultant field.

Figure 2B:
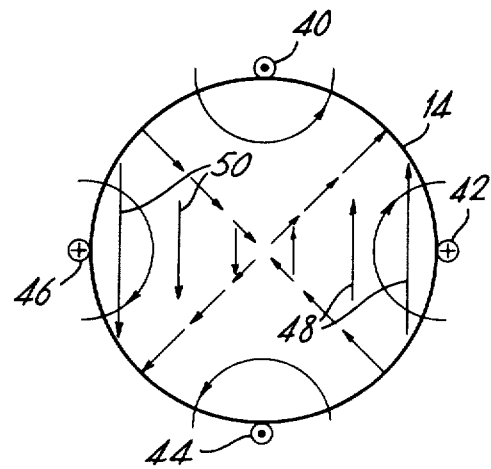

In FIG. 2(b) four conductors 40 to 46 are arranged in a similar manner to those of FIG. 2(a) except that the pattern is displaced by 45° of arc on the circumference of the surface 14. The resulting saddle field is similarly displaced but the component fields may be resolved to give the vectors 48, 50 which correspond to the gradient pattern required in FIG. 1(b). Again the components parallel to the diameter containing conductors 42 and 46 may be disregarded.

If now the conductor arrangements of FIGS. 2(a) and 2(b) are interpolated the two gradient patterns of FIGS. 1(a) and 1(b) can be provided, whilst retaining independent control of the currents in the two windings and therefore of the gradient values. In the practice of the invention the poles represented by the single conductors 28 to 34 and 40 to 46 are produced by overlapping multiple turn windings. The inventive concept further extends to the non-uniform distribution of such individual windings to form on overlapping a substantially uniform array of conductors which is effective as a Faraday shield.

Figure 3:
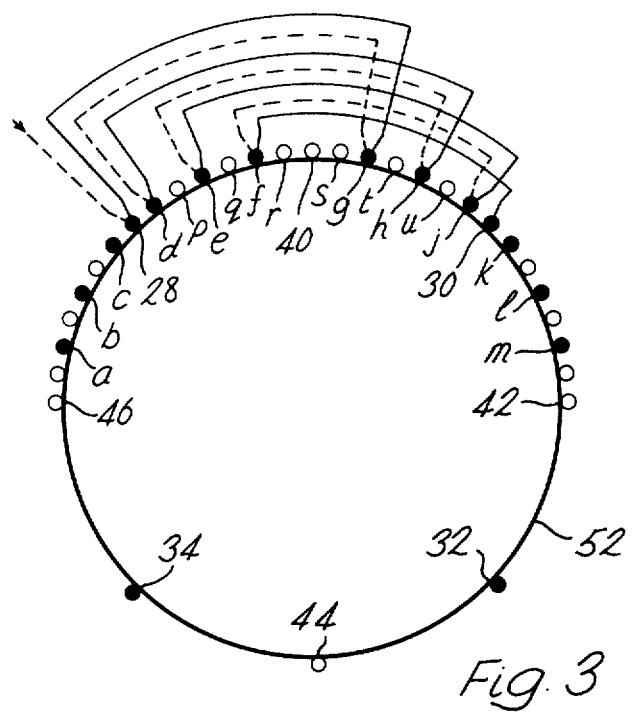
FIG. 3 represents diagrammatically a coil in accordance with the invention.

FIG. 3 shows an end view of a cylindrical coil former 52 carrying two sets of conductors in the manner of those indicated in FIGS. 2(a) and 2(b). Sets of conductors associated with the conductors 28, 30, 32, 34 respectively are connected to form one independent winding and sets of conductors associated with the conductors 40, 42, 44, 46 respectively are connected to form a second independent winding. The winding pattern is illustrated by conductors a to f which are associated with conductor 28 and carry current in the same sense as that conductor; similarly conductors g to m are associated with conductor 30 and carry current in the same sense as that conductor. In order to produce current flow in opposite senses in conductors 28 and 30 the associated conductors are interconnected in the following way. Connections at the remote end of former 52 are shown in FIG. 3 by dotted lines and those at the nearer end by full lines and correspondingly the direction of current flow will be described as UP or DOWN. For a current input to the remote end of conductor 28 the sequence commences: 28 (UP), g (DOWN), d (UP), h (DOWN), e (UP), j(DOWN), f (UP), 30 (DOWN).

The pattern is then repeated, identically except for a reversal of current, in the next quadrant, bounded by conductors 30 and 32. This sequence of connection is advantageous in that current paths at the ends of the former are kept short. Other sequences are possible but may involve longer circumferential current paths at the ends of the former, resulting in unwanted axial magnetic fields and inductive interaction with the high-frequency magnetic field.

For the second winding only the conductors p to u associated with conductor 40 are shown. It should be noted that each group of associated conductors is distributed non-uniformly over a quadrant, being closely spaced at the centre of the quadrant and more widely spaced towards the limits of the quadrant. Adjacent groups belonging to different quadrupoles overlap in the sense that the outer conductors of the two groups are interlaid so that no conductor is overlain by another.

Two conditions must be satisfied: first, although non-uniform in distribution, each winding must preserve the identity and location of each pole of the quadrupole structures and second, the number of associated conductors must be chosen in relation to the circumference of the former 52 so that particularly in the regions of dense overlap all the conductors can be accommodated but so that the widest gap between conductors is not sufficient to allow interfering electric fields to penetrate inside the former 52.

Figure 4:
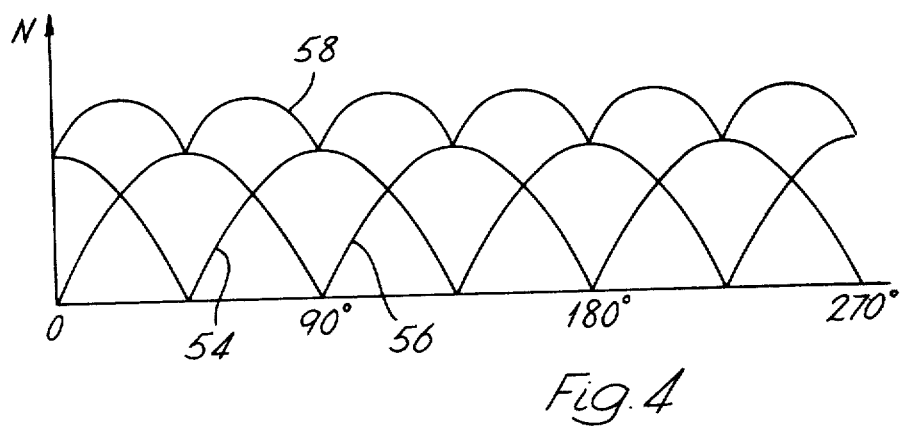
FIG. 4 represents graphically the variation of winding density on the coil of FIG. 3.

A pattern of conductor distribution which has been found effective is illustrated in FIG. 4. Any point on the circumference of former 52 is identified by the angle $\theta$ of displacement from conductor 40 in a clockwise direction. The density of winding at that point on the circumference, expressed as N conductors per radian, is given by the relationships:

$N_1 = N_o \cos 2\theta$ for the winding 40, 42, 44, 46 etc. and $N_2 = N_o \sin 2\theta$ for the winding 28, 30, 32, 34 etc. where $N_o$ is the value of maximum density for each winding. The winding arrangements are completely defined if each change of sign in $N_1$ or $N_2$ is interpreted as a reversal of current direction. For simplicity in FIG. 4 a cosine curve 54 is drawn unidirectionally to show the numerical value of $N_1$ and a sine curve 56 to show similarly the numerical value of $N_2$. Self-evidently a maximum in $N_1$ coincides with a zero value of $N_2$, the positions being interchanged at intervals of 45°. The cumulative winding density equal to the sum of curves 54 and 56 is represented by curve 58, a sine wave of doubled frequency being superimposed on the previous maximum values for $N_1$ and $N_2$. The greatest density to be accommodated is therefore $\sqrt{2}$ times the individual maximum and occurs at 22.5° and at subsequent 45° intervals.

It can be shown that $N_o$ is also the number of conductors to be provided for each winding in each quadrant. The determination of $N_o$ and the distribution of the outer conductors from adjacent poles of the two windings can be performed manually when the dimensions of the conductors and of former 52 are known but it has been found useful to develop a simple computer program for the purpose.

In the context of NMR imaging a field gradient coil constructed as described with reference to FIG. 3 is advantageously employed in the assembly shown in FIG. 5. For a human subject a field gradient coil 60 is wound on a former 52 of 500 mm diameter, one meter in length. The length of the winding is of course less than the length of former 52 but should provide a ratio of length:diameter substantially greater than unity to ensure a satisfactory uniformity of field gradient. Wire of 1.8 mm diameter is found to be suitably spaced by adopting a value of $N_o=19$ and the windings are held in position and simultaneously insulated by a layer of thermosetting resin 62. A high frequency coil 64 is then wound with copper tubing directly over the resin layer 62 about the axis of the former 52. For the best signal: noise ratio coil 64 should be positioned symmetrically on the former 52 and must be operated in an electrically balanced mode. The field gradient windings then provide effective Faraday shielding both when the coil 64 is driven to apply a high-frequency magnetic field to the sample and when it is connected to a receiver-amplifier to detect signals induced by the precession of nuclei in the sample. The mutual inductance between the field gradient windings and between either of these windings and the high frequency coil is close to zero so that effectively there is no interaction between the windings in operation. If the coil 64 is not balanced the signal:-noise ratio is likely to be degraded; even more seriously, in the detection mode, the human subject being partly outside the coil may act as an aerial and introduce interference.

Figure 5:
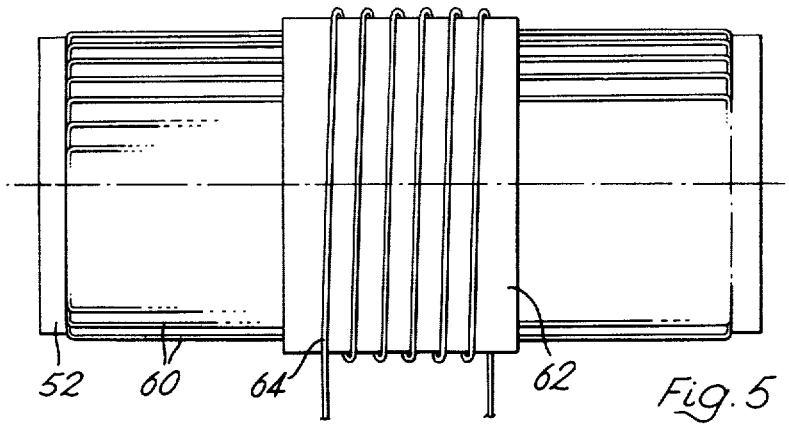
FIG. 5 represents diagrammatically a field gradient coil overwound with a high frequency coil for use in NMR.
Figure 6:
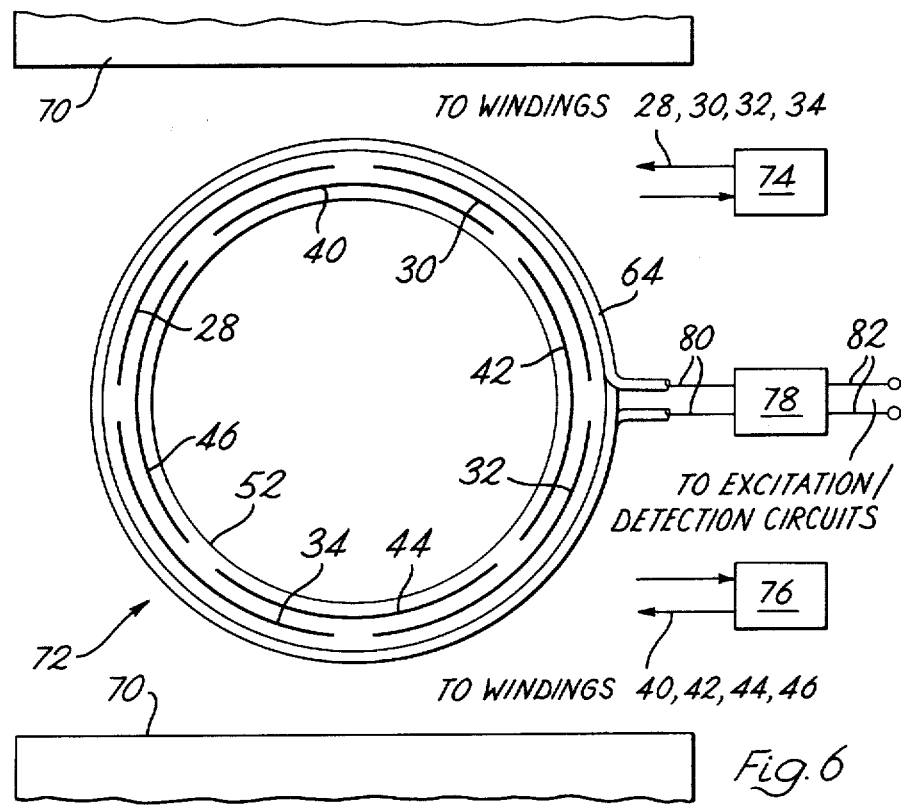
FIG. 6 represents schematically NMR apparatus incorporating the coil of FIG. 5.

A schematic nuclear magnetic resonance arrangement embodying the coil of FIG. 5 is indicated in FIG. 6. A uniform magnetic field $B_o$ is established between two parallel planar pole pieces 70. A cylindrical coil assembly 72 seen in end view lies between the pole pieces 70 and a sample (not shown) is placed within the coil. The assembly 72 comprises a cylindrical former 52 wound in the manner shown in FIGS. 3 and 5, the polar windings respectively grouped about the conductors 28, 30, 32, 34 and 40, 42, 44, 46 being indicated by correspondingly numbered arcs. The high frequency coil 64 of FIG. 5 is wound closely over the polar windings but for simplicity the insulating layer 62 has been omitted. A variable power supply 74 energises polar windings 28, 30, 32, 34 and a similar independent supply 76 energises the windings 40, 42, 44, 46. A unit 78 provides a balanced connection 80 to high frequency coil 64 and is connected at 82 selectably to the excitation or detection circuits of the NMR instrumentation (not shown).

In the conventional NMR imaging arrangement referred to earlier in this specification the field gradient coil was external to the high frequency coil and its associated electrostatic screen. The assembly of FIG. 5 therefore presents a significant advantage in reduction of the volume enclosed by the field gradient coil 60 and the elimination of a separate electrostatic screen.

The scope of the invention is not however limited to an NMR context and in general the winding structure and method described with reference to FIG. 3 enable a saddle field of controlled orientation to be produced in combination with the inherent electrostatic screening feature. This is apparent from a superimposition of the fields indicated by FIGS. 2(a) and 2(b) in the absence of a strong uniform field, the direction and magnitude of the resultant field being determined by adjustment of the absolute and relative degree of excitation of the two quadrupoles.

We claim:

1. An air-cored coil for producing magnetic fields of quadrupolar configuration within a cylindrical volume comprising a pair of similar independent quadrupole windings uniformly interpolated on the circumference of the cylindrical surface, the winding of each pole comprising a plurality of conductors lying longitudinally on the surface and distributed symmetrically over a respective quadrant of the circumference such that the winding density is greatest at the centre of the quadrant, the outer conductors of adjacent pole windings being interlaid to produce over the cylindrical surface a substantially uniform array of conductors in a single layer such as to be effective as an electrostatic screen between the cylindrical volume and the space adjacent the external surface of the conductors.

2. A coil according to claim 1 in which the density of each pole winding is varied in proportion to $\cos 2\theta$, the density being expressed as the number of conductors per radian and $\theta$ being the angular displacement from the centre of the winding.

3. Nuclear magnetic resonance apparatus comprising a field gradient coil for producing magnetic fields of quadrupolar configuration within a cylindrical volume, said coil comprising a pair of similar independent quadrupole windings uniformly interpolated on the circumference of the cylindrical surface, the winding of each pole comprising a plurality of conductors lying longitudinally on the surface and distributed symmetrically over a respective quadrant of the circumference such that the winding density is greatest at the centre of the quadrant, the outer conductors of adjacent pole windings being interlaid to produce over the cylindrical surface a substantially uniform array of conductors effective as an electrostatic screen, and means for exposing a sample within the coil to a uniform magnetic field directed substantially diametrically, the coil being so disposed as to produce a desired field gradient in a first direction with respect to the uniform field and a further desired field gradient in a second direction perpendicular to the first direction.

4. Apparatus according to claim 3 in which a high-frequency coil is wound helically over the field gradient coil about the axis of the cylindrical surface.

5. Apparatus according to claim 4 including means for electrically balanced connection of the high frequency coil in operation.

6. Apparatus according to claim 3 in which the internal diameter of the field-gradient coil is sufficient to accommodate a human subject.

7. Apparatus according to claim 6 in which the ratio of length to diameter of the field-gradient coil is at least 1.5:1.

* * * * *